(12) United States Patent
Hente

(10) Patent No.: US 9,295,131 B2
(45) Date of Patent: Mar. 22, 2016

(54) SEGMENTED ELECTROLUMINESCENT DEVICE WITH DISTRIBUTED LOAD ELEMENTS

(71) Applicant: OLEDWORKS GMBH, Aachen (DE)

(72) Inventor: Dirk Hente, Wuerselen (DE)

(73) Assignee: OLEDWORKS GMBH (DE)

( * ) Notice: Subject to any disclaimer, the term of this patent is extended or adjusted under 35 U.S.C. 154(b) by 0 days.

(21) Appl. No.: 14/383,591

(22) PCT Filed: Mar. 1, 2013

(86) PCT No.: PCT/IB2013/051653
§ 371 (c)(1),
(2) Date: Sep. 8, 2014

(87) PCT Pub. No.: WO2013/132401
PCT Pub. Date: Sep. 12, 2013

(65) Prior Publication Data
US 2015/0097482 A1    Apr. 9, 2015

Related U.S. Application Data

(60) Provisional application No. 61/608,157, filed on Mar. 8, 2012.

(51) Int. Cl.
*G09G 3/10* (2006.01)
*H05B 33/08* (2006.01)
*H01L 27/32* (2006.01)
*H05K 1/02* (2006.01)
*F21V 29/00* (2015.01)
*H05K 1/18* (2006.01)

(52) U.S. Cl.
CPC .......... *H05B 33/0896* (2013.01); *F21V 29/246* (2013.01); *H01L 27/3204* (2013.01); *H05B33/0821* (2013.01); *H05K 1/0201* (2013.01); *H01L 2251/5361* (2013.01); *H05K 1/0209* (2013.01); *H05K 1/182* (2013.01); *H05K 2201/0116* (2013.01); *H05K 2201/062* (2013.01); *H05K 2201/10022* (2013.01); *H05K 2201/10106* (2013.01)

(58) Field of Classification Search
CPC . H01L 27/3204; H01L 51/5203; H01L 51/52; H01L 2251/5361
USPC ............... 257/40, 72, 98–100, 642–643, 759; 315/169.1, 169.3; 313/498–512; 427/58, 64, 66, 532–535, 539; 428/690, 691, 917
See application file for complete search history.

(56) References Cited

U.S. PATENT DOCUMENTS

| 6,498,592 | B1 | 12/2002 | Matthies |
| 7,714,348 | B2 * | 5/2010 | Fan .......................... H01L 27/15 257/536 |
| 2008/0231180 | A1 | 9/2008 | Waffenschmidt et al. |
| 2012/0049725 | A1 * | 3/2012 | Hente ..................... H01L 51/52 313/503 |

FOREIGN PATENT DOCUMENTS

| WO | 2010125493 A1 | 11/2010 |
| WO | 2010125494 A1 | 11/2010 |

* cited by examiner

*Primary Examiner* — Minh D A
*Assistant Examiner* — Borna Alaeddini
(74) *Attorney, Agent, or Firm* — Rossi, Kimms & McDowell LLP

(57) ABSTRACT

The invention relates to an electroluminescent lighting device, which is based on an array of standard electroluminescent tiles ($D_1$-$D_n$) combined with an array of ballast components ($R_1$-$R_n$) mounted on a carrier board (30) in such a way that the power loss is evenly spread across the whole board area to minimize local electric power in the ballast components. The unavoidable remaining hot spots and electroluminescent tiles are thermally coupled in such a way that the additional thermal load on the electroluminescent emission layer is as symmetric as possible with respect to the self heating of the electroluminescent device. This can be achieved by a combination of properly designed heat spreading and thermal isolation of the electroluminescent and ballast components. Heat spreading is achieved by a properly designed interconnection structure (40) on the carrier board. Different options are proposed to thermally isolate the electroluminescent tiles from the hot spots.

14 Claims, 5 Drawing Sheets

SEGMENTED ELECTROLUMINESCENT DEVICE WITH DISTRIBUTED LOAD ELEMENTS

CROSS-REFERENCE TO PRIOR APPLICATIONS

This application is the U.S. National Phase application under 35 U.S.C. §371 of International Application No. PCT/IB13/051653, filed on Mar. 1, 2013, which claims the benefit of U.S. Provisional Patent Application No. 61/608,157, filed on Mar. 8, 2012. These applications are hereby incorporated by reference herein.

FIELD OF THE INVENTION

The present invention relates to the field of electroluminescent devices, and more particularly to organic light emitting diode (OLED) devices, and to the field of segmented illumination devices.

BACKGROUND OF THE INVENTION

Electroluminescent devices comprise electroluminescent material that is capable of emitting light when a current is passed through it. The material used for electroluminescent devices can be light emitting polymers or small organic molecules. Organic devices may, for example, be OLEDs. For activating electroluminescent devices, a current is applied to the electroluminescent material by means of electrodes.

More specifically, electroluminescent devices, such as OLEDs, comprise electroluminescent material disposed between electrodes. Upon application of a suitable voltage, current flows through the electroluminescent material from an anode to a cathode. Light is produced by radiative combination of holes and electrons inside the electroluminescent material.

Electroluminescent devices using organic electroluminescent material for general illumination have a forward voltage in the range of the 2 to 5 V. This low voltage makes it unsuitable for direct driving at general-purpose alternating current (AC) electric power supplies (i.e. mains). One solution of this problem is to connect as many OLED devices in series as it is required to achieve the required resistance of the electronic circuit. The problems which such kind of circuit are that the OLED peak current is much higher than the average value, so that mains current harmonics might exceed regulation limits and the OLED average and peak current values vary greatly within the mains voltage variation.

Another possible solution is an electrical circuitry known as ballast circuit or load circuit that is required to operate the OLED devices directly from mains. The ballast or load circuit converts the AC voltage of the public grid to a form which is suitable to drive an OLED light source at a prescribed lightness. Conventional alternating current OLED devices thus may comprise segmented OLEDs and distributed thin film resistive structures serving as electrical ballast or load to operate the OLEDs directly from mains, i.e., without expensive electronic driver circuits.

However, while such conventional segmented electroluminescent devices are not very flexible with regard to power distribution, they are specially designed for best electrical performance. Sometimes it may be desirable to use only standard components (i.e. OLEDs and resistors) or ballast circuits which cannot be integrated as simple thin film structures.

SUMMARY OF THE INVENTION

It is an object of the present invention to provide an electroluminescent device which can be based on an array of standard OLED tiles or segments combined with an array of ballast or load components or elements mounted on a carrier board or printed circuit board.

This object is achieved by an electroluminescent device as claimed in claim 1.

Accordingly, by providing the interconnecting structure and the isolation structure and arranging them to combine the predetermined heat spreading and thermal isolation in such a way that local power loss is minimized at hot spots on the common carrier structure and that additional thermal load on the emission layer of the electroluminescent segments is symmetrized with respect to self heating of the light emitting device, power loss can be evenly spreaded across the hole area of the common carrier substrate or carrier board. Hence, local electric power in the ballast or load components can be minimized, so that standard electroluminescent and ballast or load components can be used on a circuit board.

According to a first aspect, the load elements may be resistor elements, wherein at least one resistor element and at least one electroluminescent segment may be electrically connected in series to form a pair, wherein the electroluminescent device comprises a plurality of such pairs, and wherein the pairs are adapted to be directly operable from a power supply to which the electroluminescent device is connected. Such pairing ensured equal temperature distribution throughout the common carrier substrate.

According to a second aspect which can be combined with the above first aspect, the interconnecting structure may be adapted to provide thermal coupling between the pairs by connecting all pairs in series, and to serve as a heat spreader for heat generated by the resistor elements. Thereby, the interconnecting structure can be used to spread power loss across the area of the common carrier substrate in an even manner.

According to a third aspect which can be combined with any one of the above first and second aspects, the isolation structure may comprise an isolation pad arranged between the electroluminescent segments and the common carrier substrate, wherein electrode wires of the electroluminescent segments may be connected to the interconnecting structure. In a specific example of the third aspect, the load elements may be provided on the opposite surface of the common carrier substrate as compared to the electroluminescent segments. By mounting the electroluminescent segments via isolation pads (e.g. foam pads or the like) with low thermal conductivity, the electroluminescent segments can be thermally isolated from the common carrier substrate. If the load elements (e.g. resistors or circuits with resistors) are located on the other side of the common carrier substrate, i.e., opposite to the electroluminescent segments, maximum heat resistance between the load elements and the emission layer of the electroluminescent segments can be achieved.

According to a fourth aspect, which can be combined with any one of the above first to third aspects, the isolation structure may comprise a plurality of holes or recesses in the common carrier substrate, by which the electroluminescent segments are thermally isolated. As the hole or recess is larger than the electroluminescent segment, the segment becomes thermally isolated and the load elements can be placed closer to the electroluminescent segments.

According to a fifth aspect which can be combined with any one of the above first to third aspects, the isolation structure may comprise a plurality of glass lids sandwiched between the electroluminescent segments and the common carrier substrate. In a specific example of the fifth aspect, a respective cavity may be provided between the glass lids and the electroluminescent segments. This option allows to mount the load elements on the same side of the common carrier substrate where the electroluminescent segments are mounted, so that the thickness of the electroluminescent device can be reduced. By providing the cavity, thermal resistance can be further increased, so that the electroluminescent segment can be better isolated from the load elements. In addition, the above isolation pads can be provided between the electroluminescent segments, the glass lids, and the optional cavity to provide an even better thermal isolation.

In all the above aspects, the load elements may be resistor elements or may comprise a combination of capacitors and resistors, or may comprise a combination of capacities and current sources, wherein the current sources may be formed by a circuit of resistors, transistors and diodes.

It shall be understood that an embodiment of the invention can also be any combination of the dependent claims with claim 1.

These and other aspects of the invention will be apparent from and elucidated with reference to the embodiments described hereinafter.

DETAILED DESCRIPTION OF EMBODIMENTS

In the following embodiments, the present invention will be described on the basis of an OLED lighting device which is based on an array of standard OLED segments or tiles $D_1$ to $D_n$ combined with an array of load elements or ballast components $R_1$ to $R_n$ mounted on a carrier board (printed circuit board (PCB)) in such a way that the power loss is evenly spreaded across the whole board area to minimize local electric power in the ballast components $R_1$ to $R_n$. The unavoidable remaining hot spots (created e.g. by the ballast components $R_1$ to $R_n$) and the OLED tiles $D_1$ to $D_n$ are thermally coupled by an interconnecting structure in such a way that the additional thermal load on the OLED emission layer is as symmetric as possible with respect to the self heating of the OLED device. This is achieved by combining a properly designed heat spreading of the interconnecting structure and a thermal isolation of the OLED tiles $D_1$ to $D_n$ and the ballast components $R_1$ to $R_n$. Thus, the interconnecting structure on the PCB serves to achieve a desired heat spreading, while different options are available to thermally isolate the OLED tiles $D_1$ to $D_n$ from the hot spots. In the below first to third embodiments, thermal isolation is achieved by mounting the OLED tiles $D_1$ to $D_n$ on foam pads or other isolation pads, or mounting the OLEDs tiles $D_1$ to $D_n$ in PCB hole cuttings, or by using OLED tiles $D_1$ to $D_n$ with glass lids and optional cavities.

It is noted that the below embodiments can be used in combination with any ballast or load circuitry and not necessarily only a group of resistors $R_1$ to $R_n$. Any combination of electrical components such as resistors, capacitors, diodes etc. can be used to form the ballast or load circuit.

Figure 1:
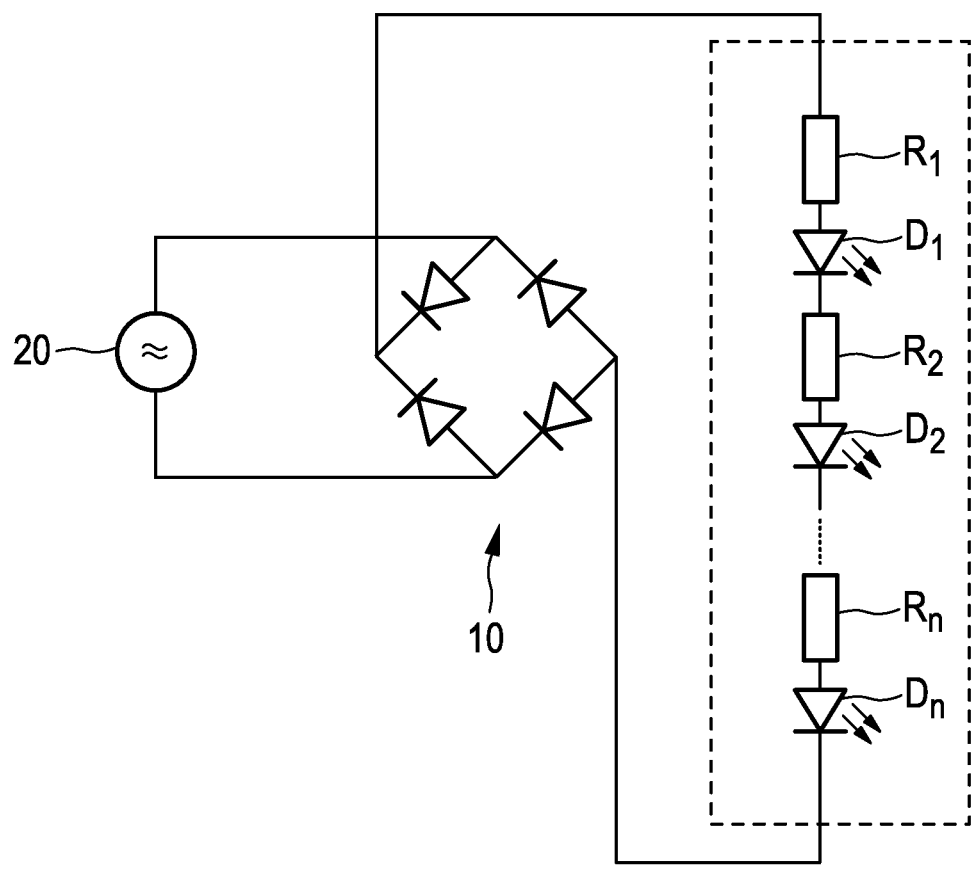
FIG. 1 shows a schematic circuit diagram of a typical electroluminescent device connected to a mains power supply.

FIG. 1 shows a schematic circuit diagram of an electrical connection of a typical OLED device comprising load elements or ballast components $R_1$ to $R_n$, and OLED tiles $D_1$ to $D_n$, connected in series. A mains voltage supplied from a voltage source 20 is rectified by a bridge rectifier circuit 10 and applied to the series connection of the OLED tiles $D_1$ to $D_n$, and the ballast components $R_1$ to $R_n$. In the present example, the number of OLED tiles $D_1$ to $D_n$, and ballast components $R_1$ to $R_n$, is the same. The resistance values of the ballast components $R_1$ to $R_n$, can be selected so that depending on the current-voltage characteristic (IV-curve) of the selected OLED tiles $D_1$ to $D_n$, the resulting average current corresponds to a desired target value while at the same time a maximum peak current value is not exceeded.

The OLED tiles $D_1$ to $D_n$, may for example be formed by bottom emitting lighting devices which comprise a pair of electrodes enclosing a stack of functional organic layers deposited on a transparent substrate like glass. Electrodes and organic layers may finally be encapsulated by one or more protective thin film layers or a glass lid which optionally has a cavity. Current may be fed into the OLED tiles $D_1$ to $D_n$, via contact strips which are bonded to the anode and cathode electrode layers on the substrate.

In the following OLED devices according to the first to third embodiments, multiple OLED tiles $D_1$ to $D_n$, are mounted on a common carrier substrate (e.g. PCB) 30. Typically, this PCB 30 may be made out of an epoxy material like FR4 having a copper foil laminated on one side. Furthermore, in all embodiments, front side F and back side B are indicated. Furthermore, an arrow may indicate the direction of the emission of light L.

Figure 2:
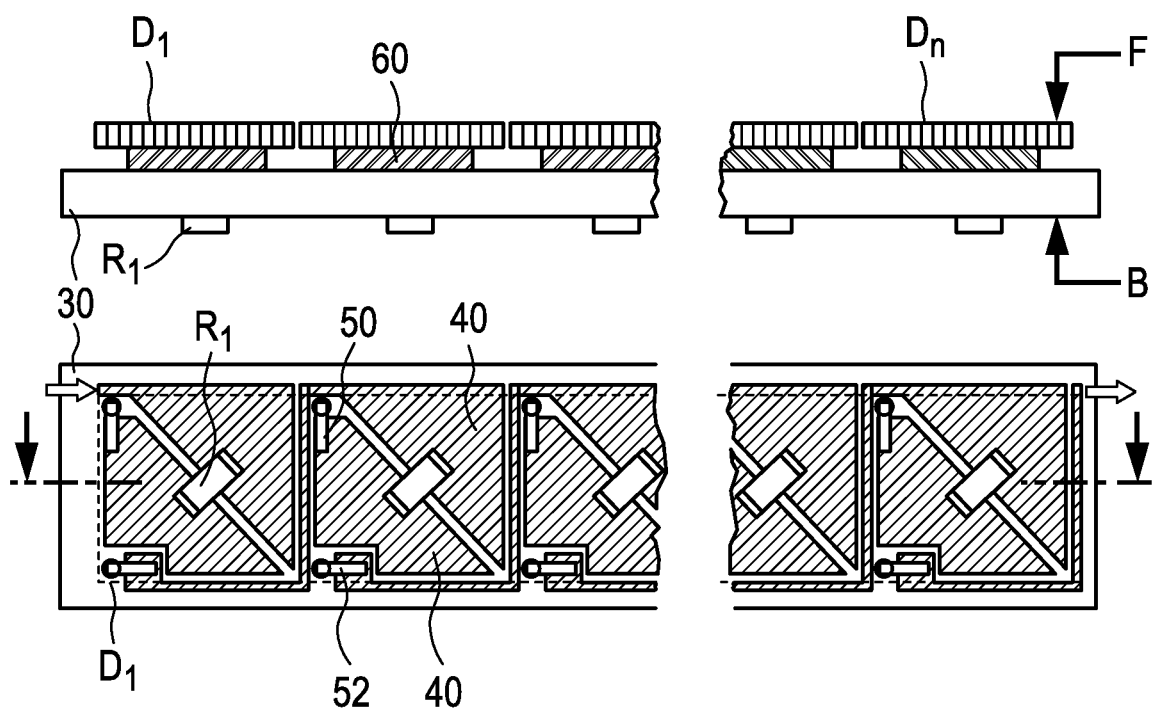
FIG. 2 shows a sectional side view and a top view on the back side of an electroluminescent device according to a first embodiment.

FIG. 2 shows an arrangement of an OLED device in sectional side view (upper portion of FIG. 2) and top view on the front side (lower portion of FIG. 2) according to a first embodiment, where the OLED tiles $D_1$ to $D_n$, are mounted via foam pads 60 onto the PCB 30. Anode and cathode contact strips 50, 52 are fed through holes in the PCB 30 and soldered to the back side of the PCB 30. On the same back side an array of surface mounted device (SMD) resistors $R_1$ to $R_n$, is soldered. Structuring of the PCB copper area or interconnection structure 40 is done in such a way that all pairs of OLED tiles $D_1$ to $D_n$, and resistors $R_1$ to $R_n$ are electrically connected in series (as shown in FIG. 1). Furthermore, the copper interconnecting structure 40 is designed in such a way that the resulting surface is as large as possible to improve heat radiation and heat spreading. By this approach an optimum thermal design can be achieved which comes very close to the ideal case where resistors are realized by conventional thin film architectures.

In the first embodiment, the resulting thermal distribution is optimized by having the OLED tiles $D_1$ to $D_n$ thermally isolated from the PCB 30 by mounting them via foam pads 60 as isolation pads which have a low thermal conductivity, by arranging the resistors $R_1$ to $R_n$ (which create hot spots) on the back side of the PCB 30 opposite to the OLED tiles $D_1$ to $D_n$, so that maximum heat resistance can be achieved between the resistors $R_1$ to $R_n$ and the OLED emission layer, and by grouping the OLED tiles $D_1$ to $D_n$, and the resistors $R_1$ to $R_n$, in pairs evenly spread across the whole area of the PCB 30. Thereby, optimal heat distribution can be achieved.

A practical implementation of the OLED device according to the first embodiment may comprise 32 OLED tiles and 32

SMD resistor groups distributed on two PCB boards. The front side of the board may comprise 16 OLED tiles and the back side of the board may be provided with an electrical interconnecting structure and SMD resistors. For each OLED tile a group of 4 SMD resistors may be soldered on the interconnection lines for a desired heat spreading. Despite the fact that the SMD resistor groups create small hot spots on the back side, these become invisible on the light emitting side of the corresponding OLED tile. The temperature increase of the OLED tile is only 3° C. compared to the case without the SMD resistors on the back side. Moreover, uniformity of temperature distribution is almost unchanged, so that effects on the light distribution are invisible to the human eye.

Figure 3:
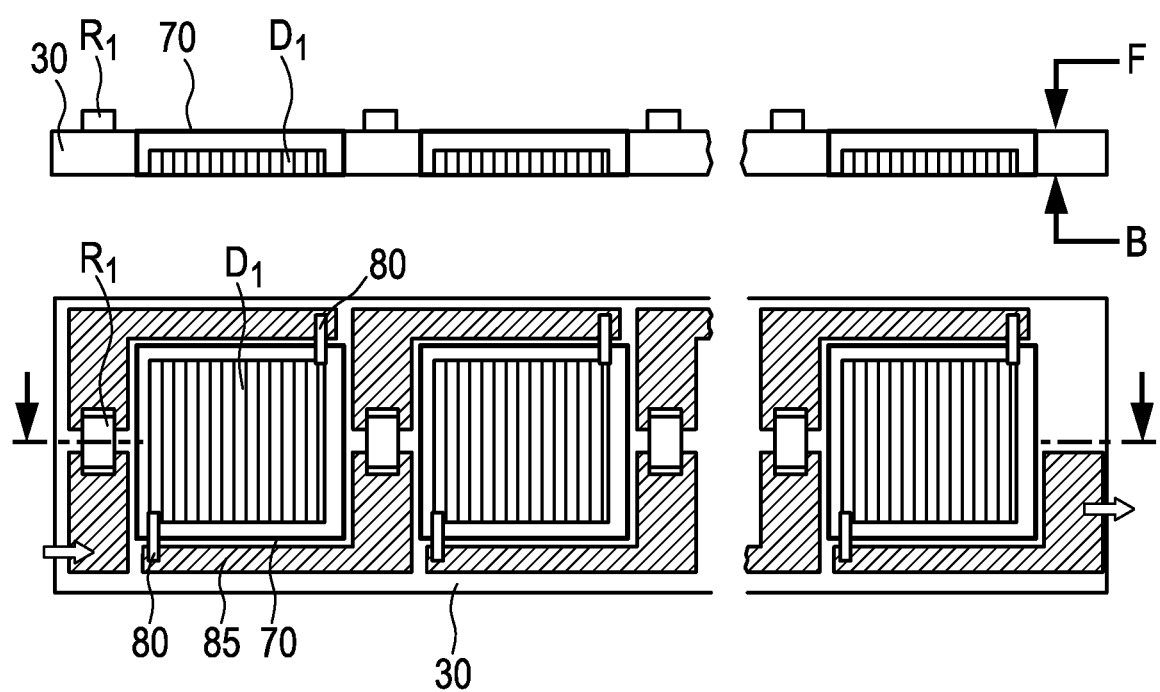
FIG. 3 shows a sectional side view and a top view on the front side of an electroluminescent device according to a second embodiment.

FIG. 3 shows an arrangement of an OLED device in sectional side view (upper portion of FIG. 3) and top view on the front side (lower portion of FIG. 3) according to a second embodiment. In the second embodiment, the PCB 30 comprises holes 70 which are a few percent larger than the lateral extension of the OLED tiles $D_1$ to $D_n$ which are mounted in such a way that they are placed in the holes 70. Typically, bonding strips 80 which are used to connect the OLED electrodes are used to fix the OLED tiles $D_1$ to $D_n$, in position. Due to the fact that the hole 70 is larger than the OLED tile $D_1$, the OLED tile $D_1$ becomes thermally isolated. The corresponding ballast component or resistor $R_1$ may for example be placed next to the board cutting off the whole enclosed vicinity to the OLED tile $D_1$. Again, the PCB 30 comprises a metal interconnecting structure 85 that allows the electrical series connection and heat spreading of the resistor losses.

The arrangement of the second embodiment allows an OLED device with minimum thickness. Furthermore, it is especially suited for thin film encapsulated OLED devices. And allows additional back side cooling for high brightness applications.

Figure 4:
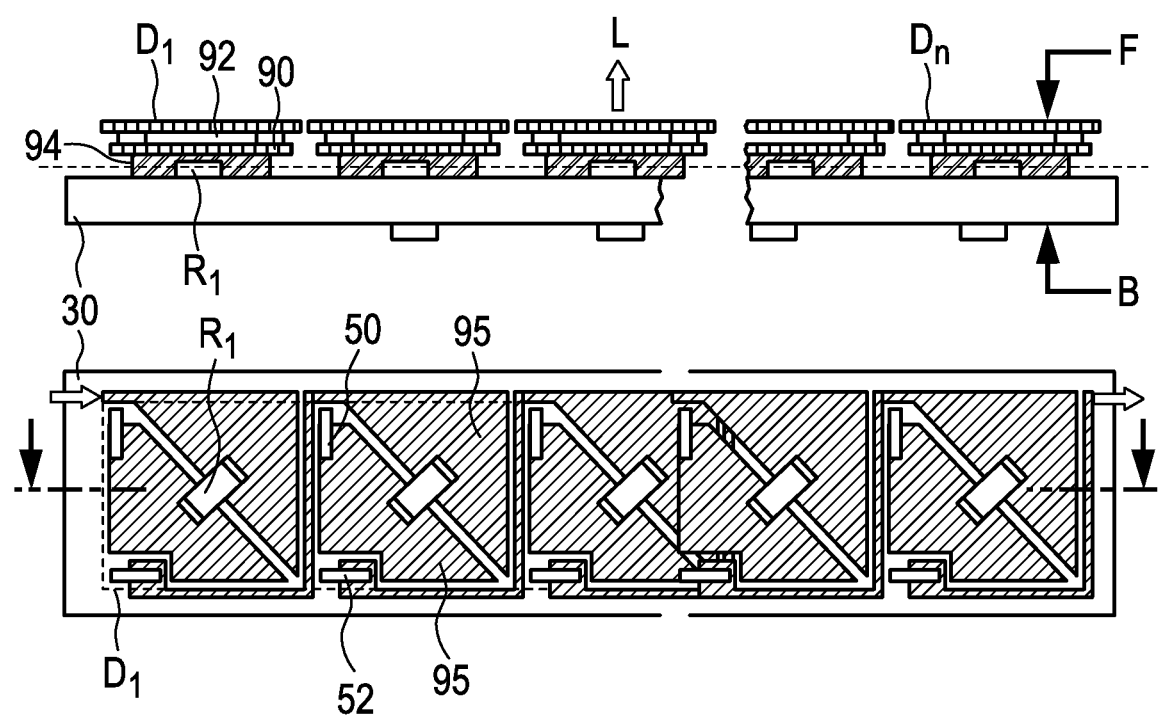
FIG. 4 shows a sectional side view and a top view on the front side of an electroluminescent device according to a third embodiment.

FIG. 4 shows an arrangement of an OLED device in sectional side view (upper portion) and top view on the front side (lower portion) according to a third embodiment, where the resistors $R_1$ to $R_n$, are located on the same side of the PCB 30 where the OLED tiles $D_1$ to $D_n$, are mounted. Compared to the first embodiment of FIG. 2 and similar to the second embodiment of FIG. 3, this allows to reduce the thickness of the lighting device. The mounting method is especially suited for OLED devices which are encapsulated by a lid glass 90 and comprise an optional cavity 92. The cavity 92 is configured to provide a comparatively high thermal resistance which alone is usually sufficient to thermally isolate the OLED tile $D_1$ from the ballast resistance $R_1$. An additional foam pad 94 may be provided to allow easy mounting on the surface of the PCB 30, which is now uneven due to the presence of the ballast resistors $R_1$. Similar to the other embodiments, an interconnecting structure 95 is provided for connection and heat spreading and connects to the anodes 50 and cathodes 52 of the OLED tiles $D_1$ to $D_n$.

Figure 5A:
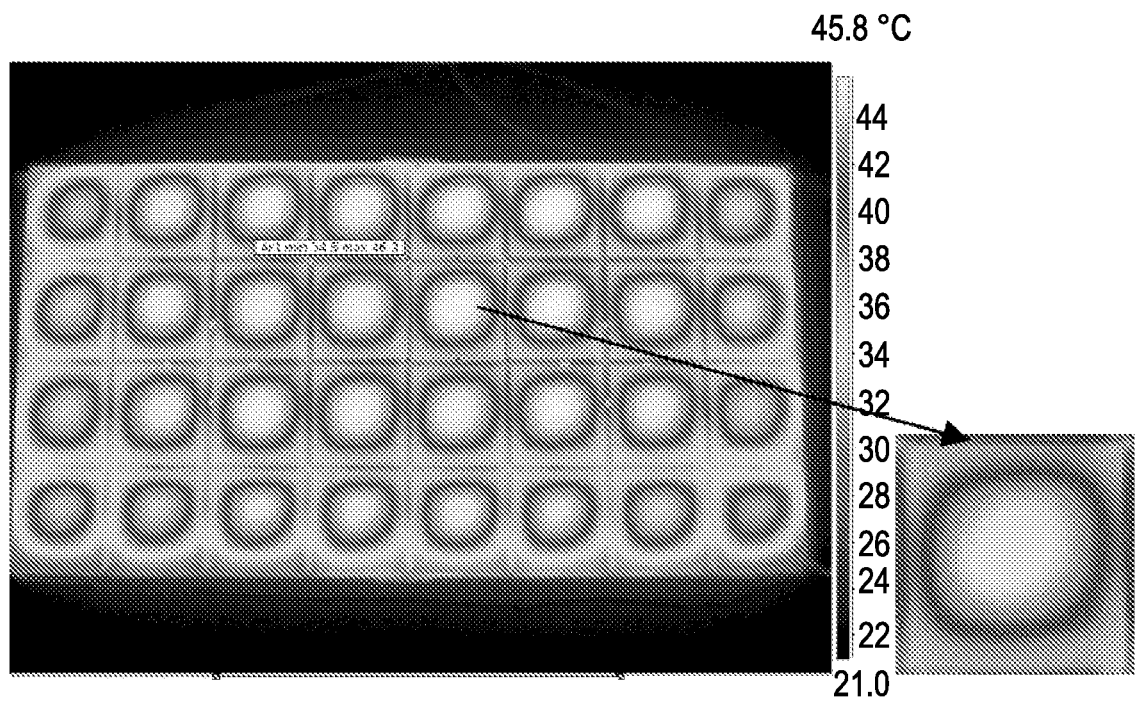
FIGS. 5A and 5B show heat distributions on a top view on the front side and the back side, respectively, of the second embodiment.
Figure 5B:
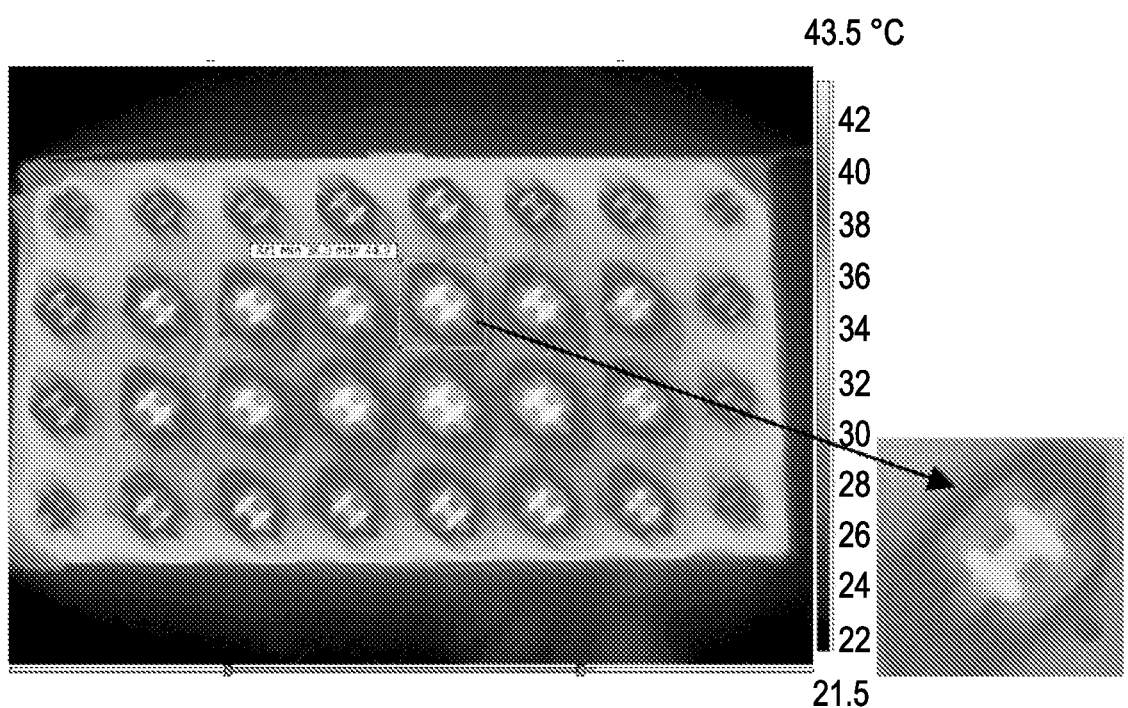

FIGS. 5A and 5B show respective heat distributions of the above implementation example of the first embodiment of FIG. 2. More specifically, FIGS. 5A and 5B show an infrared (IR) image of the temperature distribution while the OLED device is connected to a 230 V mains power supply. Despite an input power of 25 W no critical hot spot is visible on the front and back side. The temperature range is 34 to 46° C. on a front side and 36 to 45° C. on the back side. This proves that an efficient heat distribution can be obtained by the proposed OLED arrangement avoiding expensive metal core PCBs and/or aluminum heat spreaders.

Although the above description refers to specific OLED devices comprising only resistor components as ballast elements for operation at mains voltage, it is noted that the same principle can be applied to any electroluminescent device with ballast circuitries (consisting of capacitors, resistors, current sources, switch mode power supplies or the like) as long as they can be electrically and thermally distributed in an analog way as described above in connection with the first to third embodiments.

In summary, an electroluminescent lighting device has been described, which is based on an array of standard electroluminescent tiles combined with an array of ballast components mounted on a carrier board in such a way that the power loss is evenly spread across the whole board area to minimize local electric power in the ballast components. The unavoidable remaining hot spots and electroluminescent tiles are thermally coupled in such a way that the additional thermal load on the electroluminescent emission layer is as symmetric as possible with respect to the self heating of the electroluminescent device. This can be achieved by a combination of properly designed heat spreading and thermal isolation of the electroluminescent and ballast components. Heat spreading is achieved by a properly designed interconnection structure on the carrier board. Different options are proposed to thermally isolate the electroluminescent tiles from the hot spots.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

Any reference signs in the claims should not be construed as limiting the scope.

The invention claimed is:

1. An electroluminescent device comprising:
   a) a plurality of standard electroluminescent segments;
   b) a plurality of standard load elements;
   c) a common carrier substrate on which said electroluminescent segments and said elements are mounted;
   d) an interconnecting structure that is distinct from said load elements for connecting said electroluminescent segments and said load elements and for providing a predetermined heat spreading; and
   e) an isolation structure for thermally isolating said electroluminescent segments from hot spots created by said load elements;
   f) wherein said interconnecting structure and said isolation structure are arranged to combine said predetermined heat spreading and thermal isolation in such a way that local power loss is minimized at hot spots on said common carrier structure and that additional thermal load on an emission layer of said electroluminescent segments is symmetrized with respect to self heating of said light emitting device.

2. The device according to claim 1, wherein the load elements are resistor elements and wherein at least one resistor element and one electroluminescent segment are electrically connected in series to form a pair, wherein said electroluminescent device comprises a plurality of said pairs, and wherein said pairs are adapted to be directly operable from a power supply to which said electroluminescent device is connected.

3. The device according to claim 2, wherein said interconnecting structure is adapted to provide thermal coupling between said pairs by connecting all pairs in series and to serve as a heat spreader for heat generated by said resistor elements (R1-Rn).

4. The device according to claim 1, wherein said isolation structure comprises an isolation pad arranged between said electroluminescent segments and said common carrier substrate and wherein electrode wires of said electroluminescent segments are connected to said interconnecting structure.

5. The device according to claim 4, wherein said load elements are provided on the opposite surface of said common carrier substrate as compared to said luminescent segments.

6. The device according to claim 1, wherein said isolation structure comprises a plurality of holes of the common carrier structure, by which said electroluminescent segments are thermally isolated.

7. The device according to claim 1, wherein said isolation structure comprises a plurality of glass lids sandwiched between said electroluminescent segments and said common carrier structure.

8. The device according to claim 7, wherein a respective cavity is provided between said glass lids, and said electroluminescent segments.

9. The device according to claim 1, wherein said load elements comprise a combination of capacitors and resistors.

10. The device according to claim 1, wherein said load elements comprise a combination of capacitors and current sources, and wherein said current sources are formed by a circuit of resistors, transistors and diodes.

11. The device according to claim 1, wherein said interconnecting structure is arranged in a plane of said device and wherein, for at least one of said segments, said interconnecting structure is arranged symmetrically, in said plane, about a corresponding load element of said at least one of said segments.

12. The device according to claim 1, wherein said plane is parallel to a surface of said substrate on which said electroluminescent segments are mounted.

13. The device according to claim 11, wherein said interconnecting structure covers said at least one of said segments over a majority of an area delineated by said at least one of said segments.

14. The device according to claim 11, wherein said interconnecting structure surrounds a majority of said at least one of said segments.

\* \* \* \* \*